(12) United States Patent
Kim et al.

(10) Patent No.: US 10,944,600 B2
(45) Date of Patent: Mar. 9, 2021

(54) DATA TRANSMISSION CIRCUIT

(71) Applicants: SK hynix Inc., Gyeonggi-do (KR); Seoul National University R&DB Foundation, Seoul (KR)

(72) Inventors: Suhwan Kim, Seoul (KR); Joo-Hyung Chae, Seoul (KR)

(73) Assignees: SK hynix Inc., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/715,569

(22) Filed: Dec. 16, 2019

(65) Prior Publication Data

US 2020/0213166 A1 Jul. 2, 2020

(30) Foreign Application Priority Data

Dec. 26, 2018 (KR) .................. 10-2018-0169386

(51) Int. Cl.
*H03H 7/30* (2006.01)
*H04L 25/03* (2006.01)
*H03K 19/20* (2006.01)
*H03K 5/14* (2014.01)
*H03K 17/284* (2006.01)
*H04B 3/04* (2006.01)
*H03K 5/00* (2006.01)

(52) U.S. Cl.
CPC .............. *H04L 25/03* (2013.01); *H03K 5/14* (2013.01); *H03K 17/284* (2013.01); *H03K 19/20* (2013.01); *H04B 3/04* (2013.01); *H04L 25/03343* (2013.01); *H03K 2005/00019* (2013.01)

(58) Field of Classification Search
CPC ........ H04L 25/03019; H04L 25/03343; H03K 5/14; H03K 17/284; H03K 2005/00019; H04K 19/20
USPC .......................................................... 375/232
See application file for complete search history.

(56) References Cited

U.S. PATENT DOCUMENTS

| | | | | |
|---|---|---|---|---|
| 5,719,531 A * | 2/1998 | Kotani | ................... | G11C 5/025 330/261 |
| 6,826,390 B1 * | 11/2004 | Tamura | ............... | H03F 3/45183 375/346 |
| 8,705,606 B2 * | 4/2014 | Farjad-Rad | ....... | H04L 25/03159 375/232 |
| 9,544,015 B2 * | 1/2017 | Ulrich | ................ | H03K 19/0185 |
| 9,887,860 B1 | 2/2018 | Chou et al. | | |

(Continued)

FOREIGN PATENT DOCUMENTS

KR 10-2009-0039295 4/2009

*Primary Examiner* — Helene E Tayong
(74) *Attorney, Agent, or Firm* — IP & T Group LLP

(57) ABSTRACT

A data transmission circuit includes: a main driver circuit suitable for driving data to an output line; an amplitude equalization window generator circuit suitable for detecting the data transitioning from a first level to a second level; an auxiliary driver circuit suitable for driving the output line with the second level in response to a detection result of the amplitude equalization window generator circuit; and a phase equalization window generator circuit suitable for detecting whether the data consecutively has the first level, wherein the main driver circuit changes a time point of driving the data in response to a detection result of the phase equalization window generator circuit.

14 Claims, 9 Drawing Sheets

(56) References Cited

U.S. PATENT DOCUMENTS

2007/0177663 A1* 8/2007 Buckwalter ............. H03M 9/00
                                                    375/229
2016/0099819 A1* 4/2016 Ogata ................... H04L 7/0087
                                                    375/233

* cited by examiner

DATA TRANSMISSION CIRCUIT

CROSS-REFERENCE TO RELATED APPLICATIONS

The present application claims priority of Korean Patent Application No. 10-2018-0169386 filed on Dec. 26, 2018, which is incorporated herein by reference in its entirety.

BACKGROUND

1. Field

Exemplary embodiments of the present invention relate to a data transmission circuit for transmitting data.

2. Description of the Related Art

As a large amount of data needs to be processed in diverse integrated circuit applications recently, data transmission rates are required to increase higher and higher. However, as the data transmission rates increase, signal loss rates are also increasing due to factors and other reasons of a channel through which data are transmitted, and thus an equalization technique for recovering attenuated signals are attracting attention.

SUMMARY

Embodiments of the present invention are directed to a technology for compensating for loss of signals occurring while data are transmitted.

In accordance with an embodiment of the present invention, a data transmission circuit includes: a main driver circuit suitable for driving data to an output line; an amplitude equalization window generator circuit suitable for detecting the data transitioning from a first level to a second level; an auxiliary driver circuit suitable for driving the output line with the second level in response to a detection result of the amplitude equalization window generator circuit; and a phase equalization window generator circuit suitable for detecting whether the data consecutively has the first level, wherein the main driver circuit changes a time point of driving the data in response to a detection result of the phase equalization window generator circuit.

In accordance with another embodiment of the present invention, a data transmission circuit includes: first to fourth lines; a main driver circuit suitable for sequentially driving data of the first to fourth lines to an output line; an amplitude equalization window generator circuit suitable for detecting the data of the first to fourth lines transitioning from a first level to a second level; an auxiliary driver circuit suitable for driving the output line with a second level in response to a detection result of the amplitude equalization window generator circuit; and a phase equalization window generator circuit suitable for detecting whether the data of the first to fourth lines consecutively have the first level, wherein the main driver circuit changes a time point of driving the data of the first to fourth lines in response to a detection result of the phase equalization window generator circuit.

In accordance with still another embodiment, a data transmission circuit may include: a primary driver circuit configured to sequentially drive data lines to output pieces of data on the data lines to an output line; and a secondary driver circuit configured to drive the output line at the second level for a set time duration, when levels of two neighboring pieces of data among all the pieces of data transition from a first level to a second level, wherein when levels of two or more neighboring pieces of data among all the pieces of data are at the first level, the primary driver circuit drives the data line earlier by a variable amount of time than when no neighboring pieces of data are at the first level, wherein the variable amount of time in proportion to a number of the neighboring pieces having the first level.

In accordance with still another embodiment, an operation method of a data transmission circuit may include: sequentially driving data lines to output pieces of data on the data lines to an output line; driving, when levels of two neighboring pieces of data among all the pieces of data transition from a first level to a second level, the output line at the second level for a set time duration; and driving, when levels of two or more neighboring pieces of data among all the pieces of data are at the first level, the data line earlier by a variable amount of time than no neighboring pieces of data are at first level, wherein variable amount of time increases in proportion to a number of the neighboring pieces at the first level.

DETAILED DESCRIPTION

Figure 1:
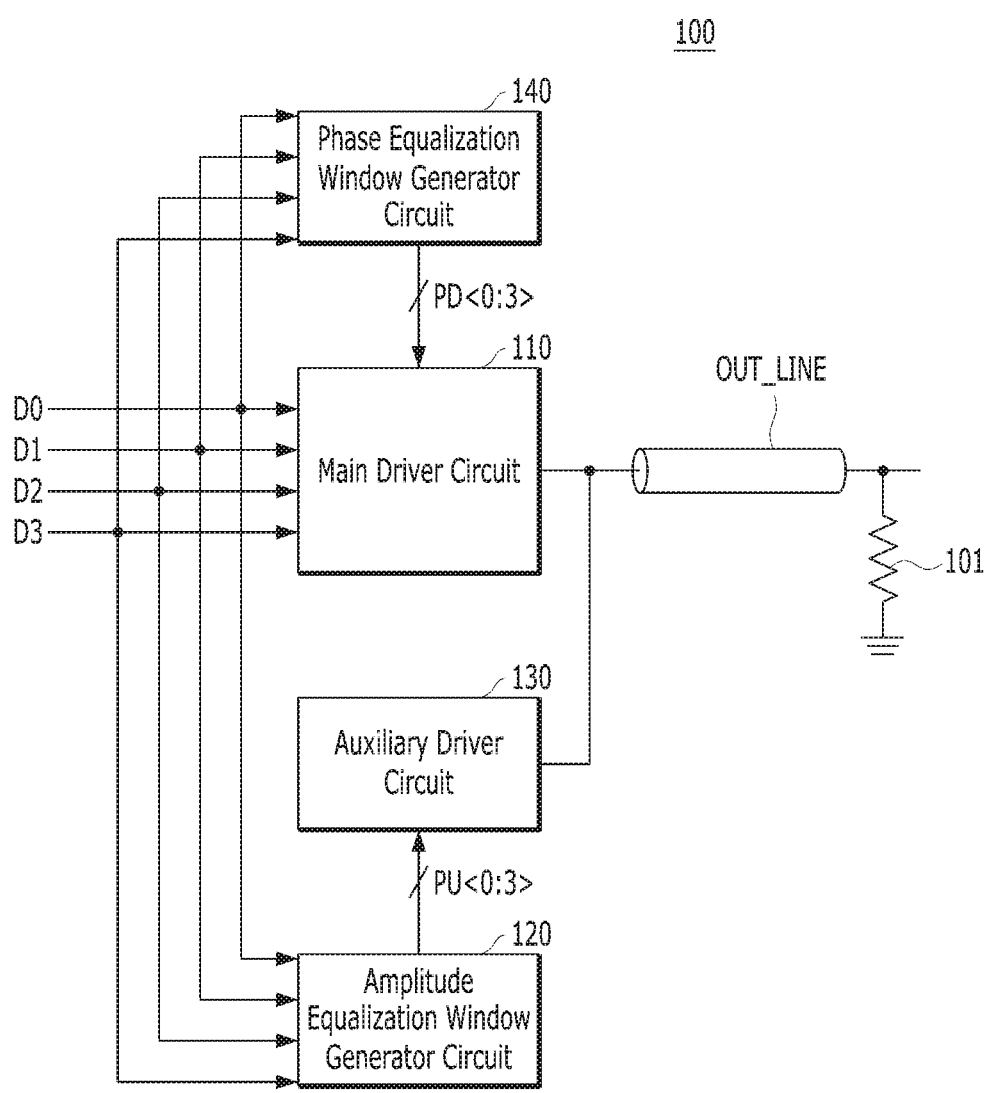
FIG. 1 is a block diagram illustrating a data transmission circuit 100 in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a data transmission circuit 100 in accordance with an embodiment of the present invention.

Referring to FIG. 1, the data transmission circuit 100 may include a main driver circuit 110, an amplitude equalization window generator circuit 120, an auxiliary driver circuit 130, and a phase equalization window generator circuit 140.

The data transmission circuit 100 may transmit a data to an output line OUT_LINE. Although it is illustrated herein that the output line OUT_LINE is low (voltage or ground)

terminated by a resistor 101, it is obvious to those skilled in the art that the output line OUT_LINE may be high (voltage or Vcc) terminated.

The main driver circuit 110 may sequentially drive first to fourth lines D0 to D3 to transmit their data to the output line OUT_LINE. For example, the main driver circuit 110 may drive the first to fourth lines D0 to D3 to output the data of the first to fourth lines D0 to D3 to the output line OUT_LINE in the order of D0, D1, D2, D3, D0, D1, D2, D3 . . . .

The amplitude equalization window generator circuit 120 may detect the data of the first to fourth lines D0 to D3 transitioning from low voltage level (or logic low level) to high voltage level (or logic high level). Herein, detecting the transition from low to high may mean that the data arranged in the order of D0, D1, D2, D3, D0, D1, D2, D3 . . . are detected as transitioning from logic low level to logic high level. That is, the amplitude equalization window generator circuit 120 may detect levels of two neighboring ones (e.g., D0 and D1, or D1 and D2, or D2 and D3, or D3 and D0) among the data of the first to fourth lines D0 to D3 to transition from a logic low level to a logic high level. When the output line OUT_LINE is low terminated, the amplitude equalization window generator circuit 120 may detect that the data of the first to fourth lines D0 to D3 transition from logic low level to logic high level. However, when the output line OUT_LINE is high terminated, the amplitude equalization window generator circuit 120 may detect that the data of the first to fourth lines D0 to D3 transition from logic high level to logic low level. In other words, the amplitude equalization window generator circuit 120 may be able to detect that the data of the first to fourth lines D0 to D3 transition from a first level to a second level, where the first level may be a logic low level and the second level may be a logic high level, and the first level may be a logic high level and the second level may be a logic low level.

The auxiliary driver circuit 130 may drive the output line OUT_LINE to a logic high level in response to a detection result PU<0> to PU<3> of the amplitude equalization window generator circuit 120. When the output line OUT_LINE is low terminated, the auxiliary driver circuit 130 may drive the output line OUT_LINE to a logic high level in response to a detection result PU<0:3> of the amplitude equalization window generator circuit 120. However, when the output line OUT_LINE is high terminated, the auxiliary driver circuit 130 may drive the output line OUT_LINE to a logic low level in response to the detection result PU<0:3> of the amplitude equalization window generator circuit 120.

The phase equalization window generator circuit 140 may detect whether the data of the first to fourth lines D0 to D3 have low levels consecutively. Herein, detecting whether the data have low levels consecutively may mean that it is detected whether or not the data arranged in the order of D0, D1, D2, D3, D0, D1, D2, D3 . . . have low levels consecutively. That is, the phase equalization window generator circuit 140 may detect levels of two or more neighboring ones (e.g., three neighboring pieces D0 to D2, or D1 to D3, or D2 to D0, or D3 to D1) among the data of the first to fourth lines D0 to D3 to have the low level. When the output line OUT_LINE is low terminated, the phase equalization window generator circuit 140 may detect whether the data of the first to fourth lines D0 to D3 have low levels consecutively. However, when the output line OUT_LINE is high terminated, the phase equalization window generator circuit 140 may detect whether the data of the first to fourth lines D0 to D3 have high levels consecutively.

The detection result PD<0:3> of the phase equalization window generator circuit 140 may be transmitted to the main driver circuit 110, and the moment when the main driver circuit 110 drives the data of the first to fourth lines D0 to D3 to the output line OUT_LINE may be controlled based on the detection result PD<0:3>.

Figure 2:
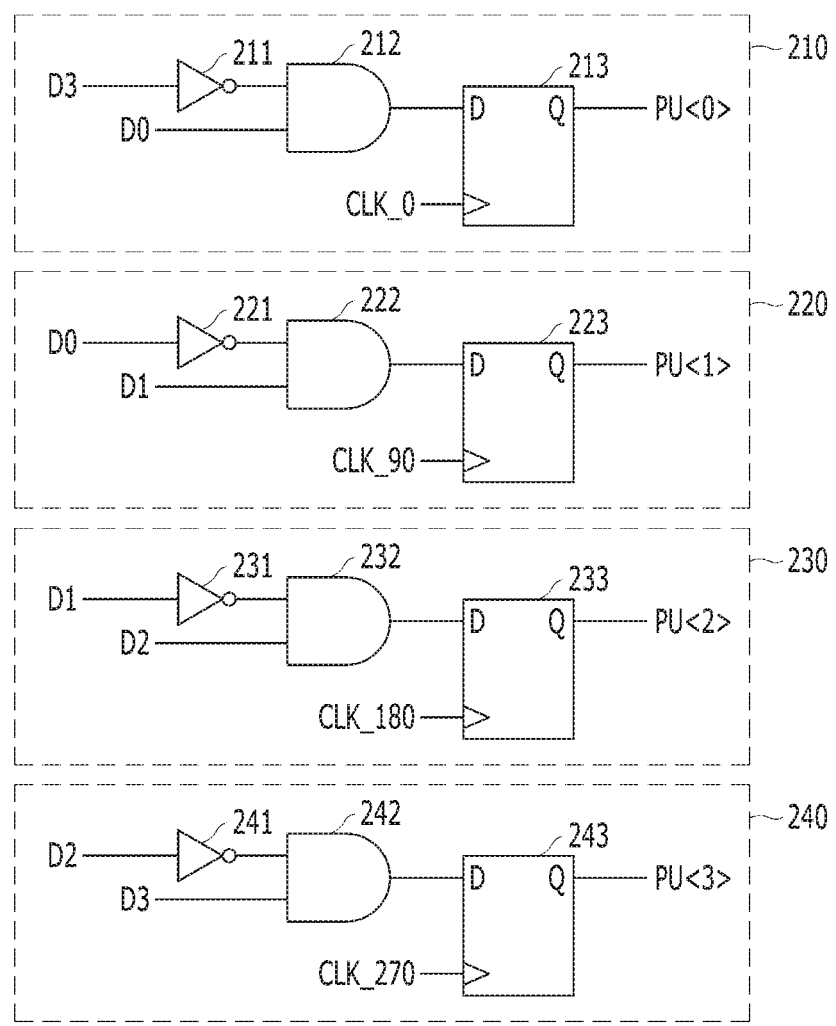
FIG. 2 is a block diagram illustrating an amplitude equalization window generator circuit shown in FIG. 1.
Figure 3:
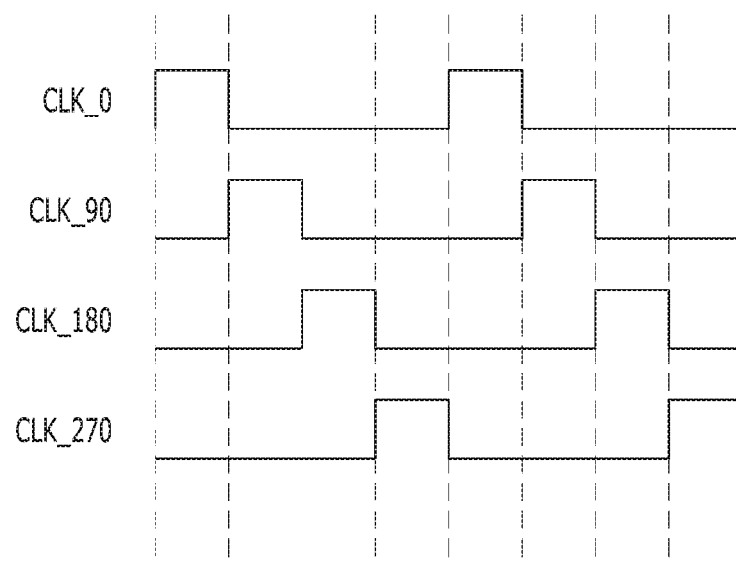
FIG. 3 is a waveform diagram illustrating first to fourth clocks.

FIG. 2 is a block diagram illustrating the amplitude equalization window generator circuit 120 shown in FIG. 1.

Referring to FIG. 2, the amplitude equalization window generator circuit 120 may include first to fourth detection circuits 210 to 240. In the data arranged in the order of D0, D1, D2, D3, D0, D1, D2, D3 . . . , the first detection circuit 210 may detect whether the data of the fourth and first lines D3 and D0 transition from low to high, and the second detection circuit 220 may detect whether the data of first and second lines D0 and D1 transition from low to high, and the third detection circuit 230 may detect whether the data of second and third lines D1 and D2 transition from low to high, and the fourth detection circuit 240 may detect whether the data of third and fourth lines D2 and D3 transition from low to high.

The first to fourth detection circuits 210 to 240 may use the first to fourth clocks CLK_0, CLK_90, CLK_180 and CLK_270, which are clocks whose phases are different from each other by 90 degrees. They may be understood as the first to fourth clocks CLK_0, CLK_90, CLK_180 and CLK_270.

When the data of the fourth line D3 is at a logic low level and the data of the first line D0 is at a logic high level at a rising edge of the first clock CLK_0, the first detection circuit 210 may activate a first amplitude equalization signal PU<0>. The first detection circuit 210 may include an inverter 211 for inverting the data of the fourth line D3, an AND gate 212 for receiving the output of the inverter 211 and the data of the first line D0, and a D flip-flop 213 for receiving the output of the AND gate 212 through a D terminal, receiving the first clock CLK_0 through a clock terminal, and outputting the first amplitude equalization signal PU<0> through a Q terminal.

When the data of the first line D0 is at a logic low level and the data of the second line D1 is at a logic high level at a rising edge of the second clock CLK_90, the second detection circuit 220 may activate a second amplitude equalization signal PU<1>. The second detection circuit 220 may include an inverter 221 for inverting the data of the first line D0, an AND gate 222 for receiving the output of the inverter 221 and the data of the second line D1, and a D flip-flop 223 for receiving the output of the AND gate 222 through a D terminal, receiving the second clock CLK_90 through a clock terminal, and outputting the second amplitude equalization signal PU<1> through a Q terminal.

When the data of the second line D1 is at a logic low level and the data of the third line D2 is at a logic high level at a rising edge of the third clock CLK_180, the third detection circuit 230 may activate a third amplitude equalization signal PU<2>. The third detection circuit 230 may include an inverter 231 for inverting the data of the second line D1, an AND gate 232 for receiving the output of the inverter 231 and the data of the third line D2, and a D flip-flop 233 for receiving the output of the AND gate 232 through a D terminal, receiving the third clock CLK_180 through a clock terminal, and outputting the third amplitude equalization signal PU<2> through a Q terminal.

When the data of the third line D2 is at a logic low level and the data of the fourth line D3 is at a logic high level at a rising edge of the fourth clock CLK_270, the fourth detection circuit 240 may activate a fourth amplitude equalization signal PU<3>. The fourth detection circuit 240 may include an inverter 231 for inverting the data of the second line D1, an AND gate 232 for receiving the output of the inverter 231 and the data of the third line D2, and a D flip-flop 233 for receiving the output of the AND gate 232 through a D terminal, receiving the third clock CLK_180 through a clock terminal, and outputting the third amplitude equalization signal PU<2> through a Q terminal.

When the data of the third line D2 is at a logic low level and the data of the fourth line D3 is at a logic high level at a rising edge of the fourth clock CLK_270, the fourth detection circuit 240 may activate a fourth amplitude equalization signal PU<3>. The fourth detection circuit 240 may include an inverter 241 for inverting the data of the second line D1, an AND gate 242 for receiving the output of the inverter 241 and the data of the third line D2, and a D flip-flop 243 for receiving the output of the AND gate 242 through a D terminal, receiving the third clock CLK_180 through a clock terminal, and outputting the third amplitude equalization signal PU<2> through a Q terminal.

Figure 4:
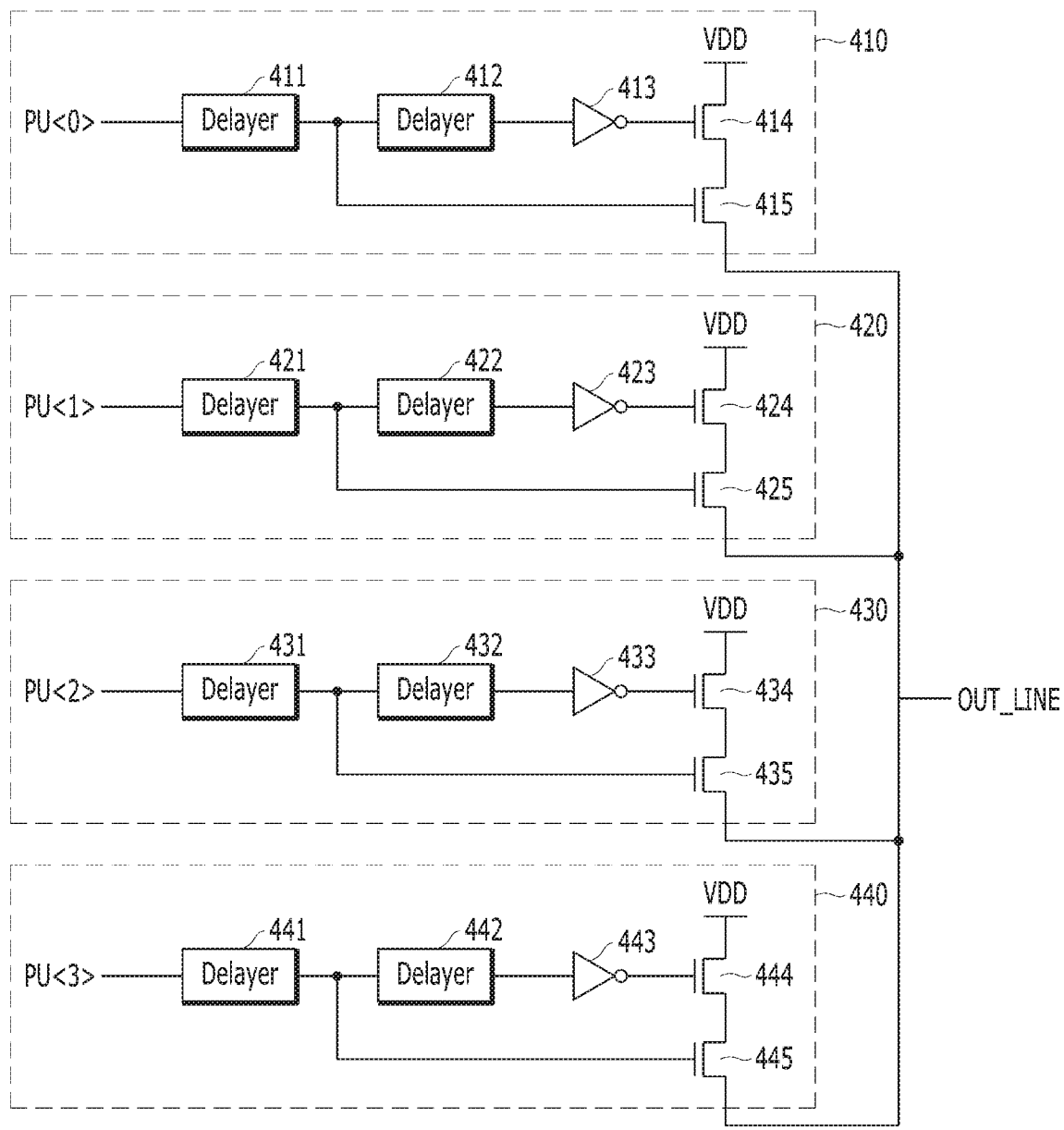
FIG. 4 is a block diagram illustrating an auxiliary driver circuit shown in FIG. 1.

FIG. 4 is a block diagram illustrating the auxiliary driver circuit 130 shown in FIG. 1.

Referring to FIG. 4, the auxiliary driver circuit 130 may include first to fourth auxiliary drivers 410 to 440.

The first auxiliary driver 410 may drive the output line OUT_LINE to a logic high level in response to the first amplitude equalization signal PU<0>. The first auxiliary driver 410 may include delayers 411 and 412, an inverter 413, and NMOS transistors 414 and 415. The first auxiliary driver 410 may drive the output line OUT_LINE to a logic high level during the time as much as a delay value of the delayer 412 from when the time as much as a delay value of the delayer 411 passes after the first amplitude equalization signal PU<0> is activated.

The second auxiliary driver 420 may drive the output line OUT_LINE to a logic high level in response to the second amplitude equalization signal PU<1>. The second auxiliary driver 420 may include delayers 421 and 422, an inverter 423, and NMOS transistors 424 and 425. The second auxiliary driver 420 may drive the output line OUT_LINE to a logic high level during the time as much as a delay value of the delayer 422 from when the time as much as a delay value of the delayer 421 passes after the second amplitude equalization signal PU<1> is activated.

The third auxiliary driver 430 may drive the output line OUT_LINE to a logic high level in response to the third amplitude equalization signal PU<2>. The third auxiliary driver 430 may include delayers 431 and 432, an inverter 433, and NMOS transistors 434 and 435. The third auxiliary driver 430 may drive the output line OUT_LINE to a logic high level during the time as much as a delay value of the delayer 432 from when the time as much as a delay value of the delayer 431 passes after the third amplitude equalization is signal PU<2> is activated.

The fourth auxiliary driver 440 may drive the output line OUT_LINE to a logic high level in response to the fourth amplitude equalization signal PU<3>. The fourth auxiliary driver 440 may include delayers 441 and 442, an inverter 443, and NMOS transistors 444 and 445. The fourth auxiliary driver 440 may drive the output line OUT_LINE to a logic high level during the time as much as a delay value of the delayer 442 from when the time as much as a delay value of the delayer 441 passes after the fourth amplitude equalization signal PU<3> is activated.

Each of the delay values of the delayers 411, 421, 431 and 441 may be designed to be the same as a basic delay value of the main driver circuit 110.

The first to fourth amplitude equalization signals PU<0:3> are activated when the data of the first to fourth lines D0 to D3 transition from row to high. Since the first to fourth auxiliary drivers 410 to 440 drive the output line OUT_LINE to a logic high level in response to the first to fourth amplitude equalization signals PU<0:3>, the output line OUT_LINE may be driven to a logic high level more strongly when the data of the first to fourth lines D0 to D3 transition from row to high.

Figure 5:
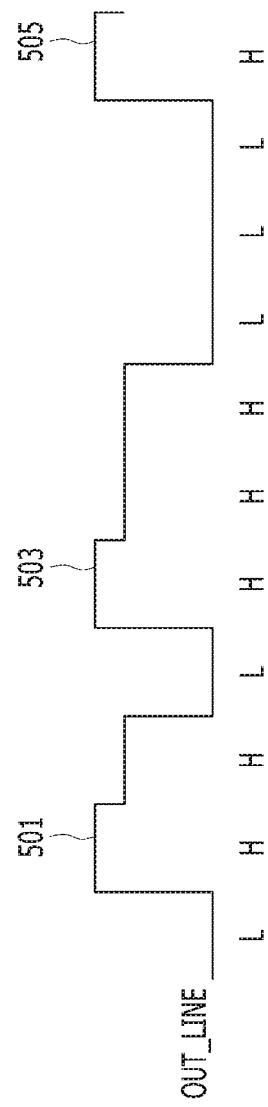
FIG. 5 is a diagram illustrating an output line being driven by a main driver circuit and the auxiliary driver circuit 130.

FIG. 5 is a diagram illustrating the output line OUT_LINE being driven by the main driver circuit 110 and the auxiliary driver circuit 130. For the sake of convenience in description, it is assumed herein that the phase equalization generator circuit 140 does not operate.

Referring to FIG. 5, it may be seen that the output line OUT_LINE is driven more strongly by the auxiliary driver circuit 130 whenever the data on the output line OUT_LINE transitions from low to high. In FIG. 5, the reference numerals 501, 503, and 505 may represent that the output line OUT_LINE is driven strongly to a logic high level by the auxiliary driver circuit 130.

It may be seen that an amplitude domain equalization operation is performed by the operation of the amplitude equalization window generator circuit and the auxiliary driver circuit. This amplitude domain equalization operation may compensate for loss of signals occurring in the long output line OUT_LINE, that is, a channel.

Figure 6:
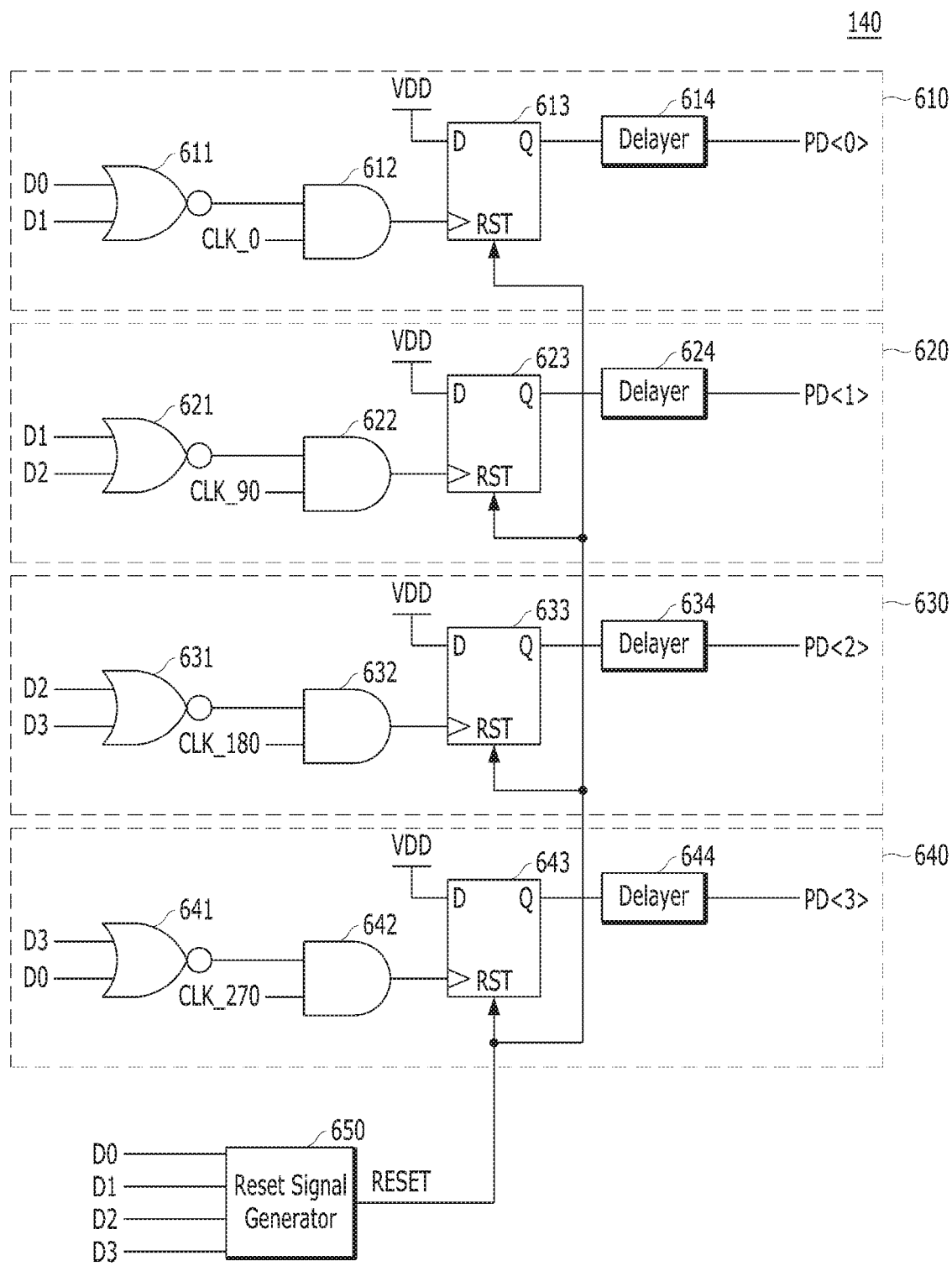
FIG. 6 is a block diagram illustrating a phase equalization window generator circuit shown in FIG. 1.

FIG. 6 is a block diagram illustrating the phase equalization window generator circuit 140 shown in FIG. 1.

Referring to FIG. 6, the phase equalization window generator circuit 140 may include first to fourth controllers 610 to 640 and a reset signal generator 650. In the data arranged in the order of D0, D1, D2, D3, D0, D1, D2, D3, . . . , the first controller 610 may detect whether the data D0 and D1 have logic low levels consecutively, the second controller 620 may detect whether the data D1 and D2 have logic low levels consecutively, the third controller 630 may detect whether the data D2 and D3 have logic low levels consecutively, and the fourth controller 640 may detect whether the data D3 and D4 have logic low levels consecutively.

When the data of the first line D0 and the data of the second line D1 are at a logic low level at a rising edge of the first clock CLK_0, the first controller 610 may activate the first phase equalization signal PD<0> and may deactivate the first phase equalization signal PD<0> when a reset signal RESET is activated. The first controller 610 may include a NOR gate 611 for receiving the data of the first line D0 and the data of the second line D1, an AND gate 612 for receiving the output of the NOR gate 611 and the first clock CLK_0, a D flip-flop 613 for receiving a power source voltage VDD through a D terminal and receiving the output of the AND gate 612 through a clock terminal and receiving the reset signal RESET through a reset terminal RST, and a delayer 614 for delaying a signal outputted through a Q terminal of the D flip-flop 613 and outputting the first phase equalization signal PD<0>.

When the data of the second line D1 and the data of the third line D2 are at a logic low level at a rising edge of the second clock CLK_90, the second controller 620 may activate the second phase equalization signal PD<1> and may deactivate the second phase equalization signal PD<1> when the reset signal RESET is activated. The second controller 620 may include a NOR gate 621 for receiving the data of the second line D1 and the data of the third line D2, an AND gate 622 for receiving the output of the NOR gate 621 and the second clock CLK_90, a D flip-flop 623 for receiving the power source voltage VDD through a D terminal and receiving the output of the AND gate 622 through a clock terminal and receiving the reset signal RESET through a reset terminal RST, and a delayer 624 for delaying a signal outputted through a Q terminal of the D flip-flop 623 and outputting the second phase equalization signal PD<1>.

When the data of the third line D2 and the data of the fourth line D3 are at a logic low level at a rising edge of the third clock CLK_180, the third controller 630 may activate the third phase equalization signal PD<2> and may deactivate the third phase equalization signal PD<2> when the reset signal RESET is activated. The third controller 630 may include a NOR gate 631 for receiving the data of the third line D2 and the data of the fourth line D3, an AND gate 632 for receiving the output of the NOR gate 631 and the third clock CLK_180, a D flip-flop 633 for receiving the power source voltage VDD through a D terminal and receiving the output of the AND gate 632 through a clock terminal and receiving the reset signal RESET through a reset terminal RST, and a delayer 634 for delaying a signal outputted through a Q terminal of the D flip-flop 633 and outputting the third phase equalization signal PD<2>.

When the data of the fourth line D3 and the data of the first line D0 are at a logic low level at a rising edge of the fourth clock CLK_270, the fourth controller 640 may activate the fourth phase equalization signal PD<3> and may deactivate the fourth phase equalization signal PD<3> when the reset signal RESET is activated. The fourth controller 640 may include a NOR gate 641 for receiving the data of the fourth line D3 and the data of the first line D0, an AND gate 642 for receiving the output of the NOR gate 641 and the fourth clock CLK_270, a D flip-flop 643 for receiving the power source voltage VDD through a D terminal and receiving the output of the AND gate 642 through a clock terminal and receiving the reset signal RESET through a reset terminal RST, and a delayer 644 for delaying a signal outputted through a Q terminal of the D flip-flop 643 and outputting the fourth phase equalization signal PD<3>.

The reset signal generator 650 may activate the reset signal RESET in a pulse form when the data of the first to fourth lines D0 to D3 transition from a logic low level to a logic high level.

Herein, each of the delay values of the delayers 614, 624, 634 and 644 may be designed to be equal to the basic delay value of the main driver circuit 110.

Figure 7:
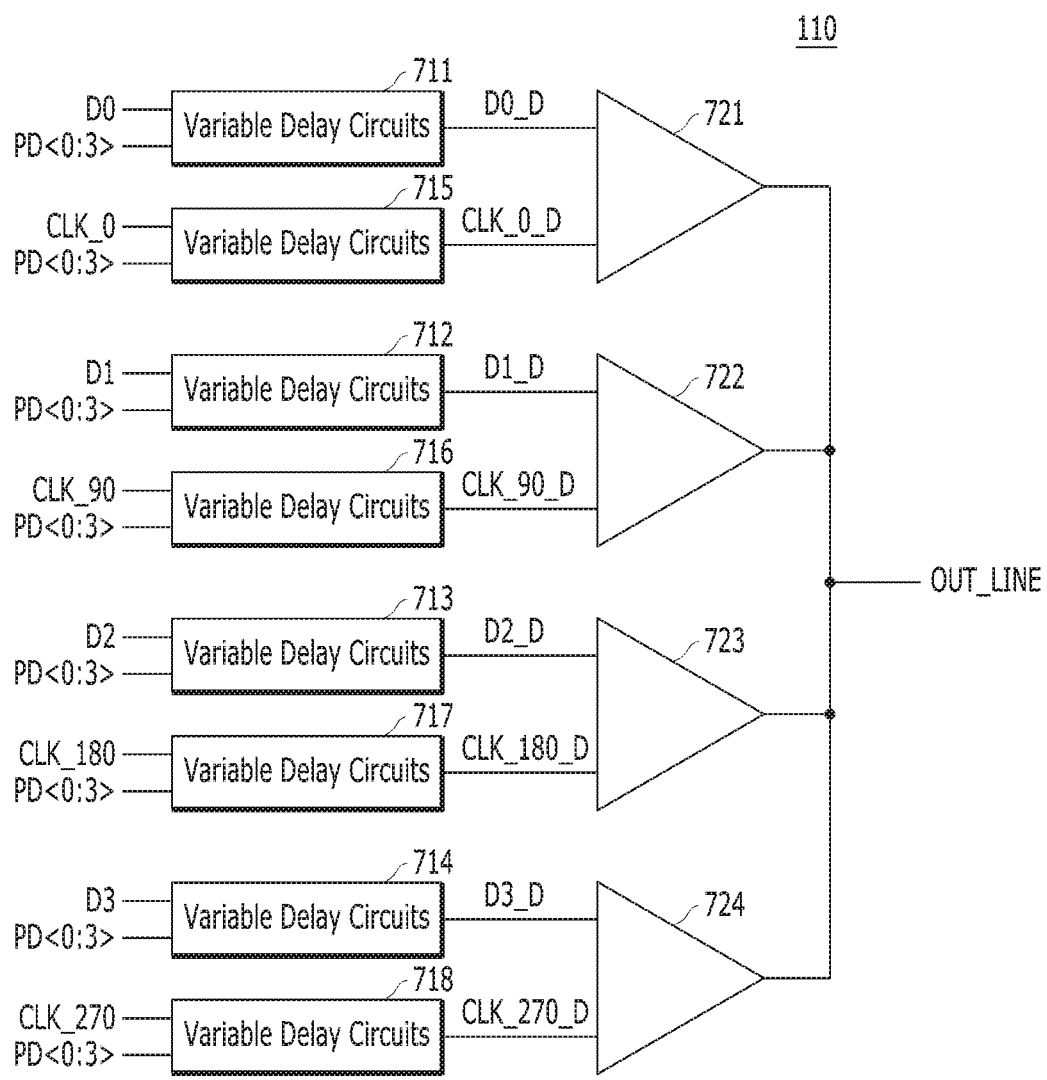
FIG. 7 is a block diagram illustrating the main driver circuit shown in FIG. 1.

FIG. 7 is a block diagram illustrating the main driver circuit 110 shown in FIG. 1.

Referring to FIG. 7, the main driver circuit 110 may include first to eighth variable delay circuits 711 to 718 and first to fourth main drivers 721 to 724.

The first to fourth variable delay circuits 711 to 714 may delay the data of the first to fourth lines D0 to D3. The delay values of the first to fourth variable delay circuits 711 to 714 may vary according to the first to fourth phase equalization signals PD<0:3>. To be specific, the delay values of the first to fourth variable delay circuits 711 to 714 may be decreased as the number of activated signals is increased among the first to fourth phase equalization signals PD<0:3>.

The fifth to eighth variable delay circuits 715 to 718 may delay the first to fourth clocks CLK_0, CLK_90, CLK_180 and CLK_270. The delay values of the fifth to eighth variable delay circuits 715 to 718 may vary according to the first to fourth phase equalization signals PD<0:3>. To be specific, the delay values of the fifth to eighth variable delay circuits 715 to 718 may be decreased as the number of the activated signals is increased among the first to fourth equalization signals PD<0:3>.

The first main driver 721 may drive a data D0_D of a delayed first line in synchronization with a delayed first clock CLK_0_D to the output line OUT_LINE. To be specific, the first main driver 721 may drive the data D0_D of the delayed first line to the output line OUT_LINE while the delayed first clock CLK_0_D is activated.

The second main driver 722 may drive a data D1_D of a delayed second line in synchronization with a delayed second clock CLK_90_D to the output line OUT_LINE. To be specific, the second main driver 722 may drive the data D1_D of the delayed second line to the output line OUT_LINE while the delayed second clock CLK_90_D is activated.

The third main driver 723 may drive a data D2_D of a delayed third line in synchronization with a delayed third clock CLK_180_D to the output line OUT_LINE. To be specific, the third main driver 723 may drive the data D2_D of the delayed third line to the output line OUT_LINE while the delayed third clock CLK_180_D is activated.

The fourth main driver 724 may drive a data D3_D of a delayed fourth line in synchronization with a delayed fourth clock CLK_270_D to the output line OUT_LINE. To be specific, the fourth main driver 724 may drive the data D3_D of the delayed fourth line to the output line OUT_LINE while the delayed fourth clock CLK_270_D is activated.

Figure 8:
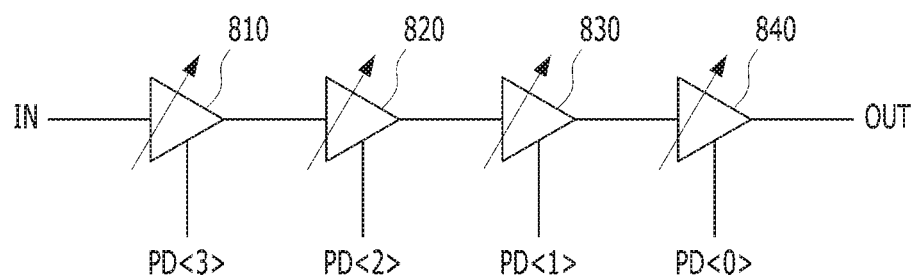
FIG. 8 is a block diagram illustrating variable delay circuits shown in FIG. 7.

FIG. 8 is a block diagram illustrating variable delay circuits 711 to 718 shown in FIG. 7. Each of the variable delay circuits 711 to 718 may be formed as shown in FIG. 8.

Referring to FIG. 8, the variable delay circuit may include variable delayers 810 to 840 that are coupled in series.

The delay value of the variable delayer 810 may be decreased when the first phase equalization signal PD<0> is activated. The delay value of the variable delayer 820 may be decreased when the second phase equalization signal PD<1> is activated. The delay value of the variable delayer 830 may be decreased when the third phase equalization signal PD<2> is activated. The delay value of the variable delayer 840 may be decreased when the fourth phase equalization signal PD<3> is activated.

The basic delay value of the main driver circuit 110 mentioned above may be a delay value of the variable delay circuit when all the first to fourth phase equalization signals PD<0:3> are deactivated. Accordingly, each of the delay values of the delayers 411, 421, 431 and 444 and the delayers 614, 624, 634 and 644 may be the same as the delay values of the variable delay circuit when the first to fourth phase equalization signals PD<0:3> are all deactivated.

Figure 9:
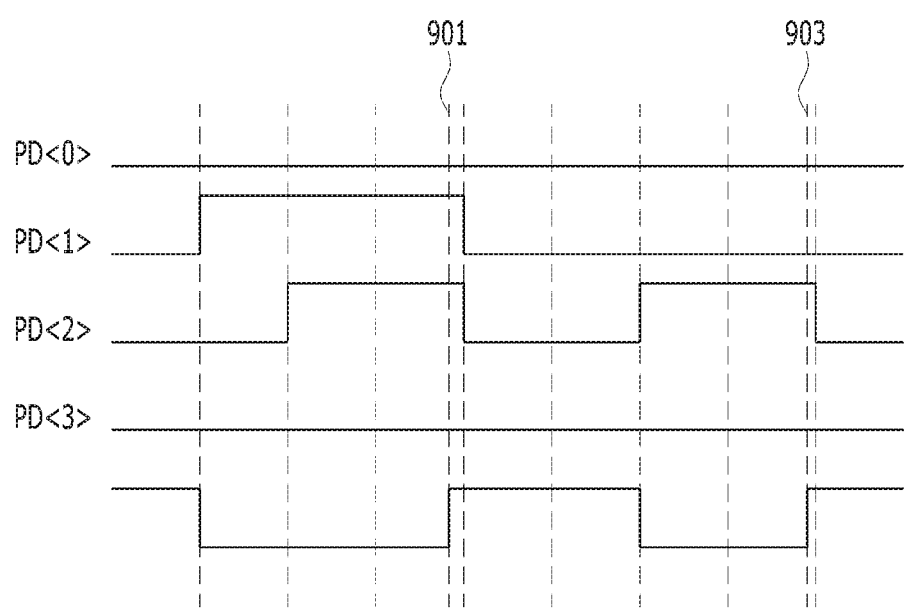
FIG. 9 is a waveform diagram illustrating an output line being driven by the operation of the main driver circuit and the phase equalization window generator circuit.

FIG. 9 is a waveform diagram illustrating the output line OUT_LINE being driven by the operation of the main driver circuit 110 and the phase equalization window generator circuit 140. The lowermost waveform is of the output line OUT_LINE in FIG. 9.

For the sake of convenience in description, it may be assumed herein that the auxiliary driver circuit 130 does not operate.

Referring to '901' of FIG. 9, it may be seen that a phase domain equalization operation in which three consecutive data of lines D1 to D3 have a logic low level so as to activate the phase equalization signals PD<1> and PD<2> and put forward a moment when a logic-high data is driven is performed.

Referring to '903', it may be seen that a phase domain equalization operation in which two consecutive data of lines D2 and D3 have a logic low level so as to activate the phase equalization signal PD<2> and put forward a moment when a logic-high data is driven is performed. In the case of '903', since the two consecutive data D2 and D3 have a logic low level, it may be seen that the extent of putting forward the moment when the logic-high data is driven is smaller than that of the case of '901' in which the three consecutive data D1 to D3 have a logic low level.

Referring to FIG. 9, when the phase domain equalization operation is performed by the operation of the main driver circuit 110 and the phase equalization window generator circuit 140, it is possible to compensate for the loss of the signal occurring in the output line, that is, a channel.

According to the embodiments of the present invention, since an amplitude domain equalization operation is performed in a section where data transitions from low to high and a phase domain equalization operation is performed in a section where the row data is continuously repeated, it is possible to compensate for the loss of signals (i.e., data) in a channel.

According to the embodiments of the present invention, it is possible to compensate for the loss of signals occurring while data are transmitted.

In accordance with an embodiment of the present invention, a data transmission circuit may include a primary driver circuit and a secondary driver circuit.

The primary driver circuit may correspond to the main driver circuit 110 and the phase equalization window generator circuit 140 described with reference to FIGS. 1 to 9.

The primary driver circuit may sequentially drive the data lines D0 to D3 to output the pieces D0 to D3 of data of the data lines D0 to D3 to the output line OUT_LINE.

In accordance with an embodiment of the present invention, the data lines D0 to D3 may be sequentially driven such that the pieces D0 to D3 of data of the data lines D0 to D3 are output to the output line OUT_LINE.

The secondary driver circuit may correspond to the amplitude equalization window generator circuit 120 and the auxiliary driver circuit 130 described with reference to FIGS. 1 to 9.

The secondary driver circuit may drive, when levels of two neighboring ones among the pieces D0 to D3 transition from a first level (e.g., a logic low level) to a second level (e.g., a logic high level), the output line OUT_LINE to the second level for a preset time duration (refer to the waveform 501 to 505 of FIG. 5).

In accordance with an embodiment of the present invention, the output line OUT_LINE may be driven to the second level for the preset time duration when levels of two neighboring ones among the pieces D0 to D3 transition from the first level to the second level.

The primary driver circuit may drives, when levels of two or more neighboring ones among the pieces D0 to D3 have the first level, the data line D0 to D3 earlier by a variable amount of time, which increases in proportional to a number of the neighboring pieces having the first level (refer to the variable amounts of time 901 and 903 in the waveforms of FIG. 9).

In accordance with an embodiment of the present invention, the data line D0 to D3 may be driven earlier by the variable amount of time when levels of two or more neighboring ones among the pieces D0 to D3 are at the first level.

In accordance with the embodiments of the present invention, since an amplitude domain equalization operation is performed when two neighboring data transition from a first level to a second level and a phase domain equalization operation is performed when two or more neighboring data have the first level, it is possible to compensate for the loss of the pieces D0 to D3 while travelling the output line OUT_LINE.

While the present invention has been described with respect to the specific embodiments, it will be apparent to those skilled in the art that various changes and modifications may be made without departing from the spirit and scope of the invention as defined in the following claims.

What is claimed is:

1. A data transmission circuit comprising:
a main driver circuit suitable for driving data to an output line;
an amplitude equalization window generator circuit suitable for detecting the data transitioning from a first level to a second level;
an auxiliary driver circuit suitable for driving the output line with the second level in response to a detection result of the amplitude equalization window generator circuit; and
a phase equalization window generator circuit suitable for detecting whether the data consecutively has the first level,
wherein the main driver circuit changes a time point of driving the data in response to a detection result of the phase equalization window generator circuit.

2. The data transmission circuit of claim 1, wherein the first level is a logic low level, the second level is a logic high level, and the output line is low terminated.

3. The data transmission circuit of claim 1, wherein the first level is a logic high level, the second level is a logic low level, and the output line is high terminated.

4. The data transmission circuit of claim 1,
wherein the phase equalization window generator circuit generates a plurality of phase equalization signals, and
wherein, as the data consecutively having the first level becomes more, the number of signals that are activated among the phase equalization signals is increased.

5. The data transmission circuit of claim 4, wherein as the number of the signals that are activated among the phase equalization signals is increased, the main driver circuit puts the time point forward.

6. A data transmission circuit comprising:
first to fourth lines;
a main driver circuit suitable for sequentially driving data of the first to fourth lines to an output line;
an amplitude equalization window generator circuit suitable for detecting the data of the first to fourth lines transitioning from a first level to a second level;
an auxiliary driver circuit suitable for driving the output line with a second level in response to a detection result of the amplitude equalization window generator circuit; and
a phase equalization window generator circuit suitable for detecting whether the data of the first to fourth lines consecutively have the first level,
wherein the main driver circuit changes a time point of driving the data of the first to fourth lines in response to a detection result of the phase equalization window generator circuit.

7. The data transmission circuit of claim 6, wherein the amplitude equalization window generator circuit includes:
a first detection circuit suitable for generating a first amplitude equalization signal which is activated when the data of the fourth line is at the first level and the data of the first line is at the second level at a rising edge of a first clock;

a second detection circuit suitable for generating a second amplitude equalization signal which is activated when the data of the first line is at the first level and the data of the second line is at the second level at a rising edge of a second clock;

a third detection circuit suitable for generating a third amplitude equalization signal which is activated when the data of the second line is at the first level and the data of the third line is at the second level at a rising edge of a third clock; and a fourth detection circuit suitable for generating a fourth amplitude equalization signal which is activated when the data of the third line is at the first level and the data of the fourth line is at the second level at a rising edge of a fourth clock.

8. The data transmission circuit of claim 7, wherein the auxiliary driver circuit includes:

a first auxiliary driver suitable for driving the output line with the second level in response to the first amplitude equalization signal;

a second auxiliary driver suitable for driving the output line with the second level in response to the second amplitude equalization signal;

a third auxiliary driver suitable for driving the output line with the second level in response to the third amplitude equalization signal; and a fourth auxiliary driver suitable for driving the output line with the second level in response to the fourth amplitude equalization signal.

9. The data transmission circuit of claim 6, wherein the phase equalization window generator circuit includes:

a first controller suitable for activating a first phase equalization signal when the data of the first line and the data of the second line are at the first level at a rising edge of a first clock, and deactivating the first phase equalization signal when a reset signal is activated;

a second controller suitable for activating a second phase equalization signal when the data of the second line and the data of the third line are at the first level at a rising edge of a second clock, and deactivating the second phase equalization signal when the reset signal is activated;

a third controller suitable for activating a third phase equalization signal when the data of the third line and the data of the fourth line are at the first level at a rising edge of a third clock, and deactivating the third phase equalization signal when the reset signal is activated;

a fourth controller suitable for activating a fourth phase equalization signal when the data of the fourth line and the data of the first line are at the first level at a rising edge of a fourth clock, and deactivating the fourth phase equalization signal when the reset signal is activated; and a reset signal generator suitable for activating the reset signal when the data of the first to fourth lines transition from the first level to the second level.

10. The data transmission circuit of claim 9, wherein the main driver circuit includes:

first to fourth variable delay circuits suitable for delaying the data of the first to fourth lines by amounts of delay values varying according to the first to fourth phase equalization signals; and fifth to eighth variable delay circuits suitable for delaying the first to fourth clocks by amounts of delay values varying according to the first to fourth phase equalization signals, wherein the delay values of the first to eighth variable delay circuits are decreased as a number of activated signals among the first to fourth phase equalization signals is increased.

11. The data transmission circuit of claim 10, wherein the main driver circuit further includes:

a first main driver suitable for driving a data of the first line, which is delayed by the first variable delay circuit, to the output line in synchronization with a first clock which is delayed by the fifth variable delay circuit;

a second main driver suitable for driving a data of the second line, which is delayed by the second variable delay circuit, to the output line in synchronization with a second clock which is delayed by the sixth variable delay circuit;

a third main driver suitable for driving a data of the third line, which is delayed by the third variable delay circuit, to the output line in synchronization with a third clock which is delayed by the seventh variable delay circuit; and a fourth main driver suitable for driving a data of the fourth line, which is delayed by the fourth variable delay circuit, to the output line in synchronization with a fourth clock which is delayed by the eighth variable delay circuit.

12. The data transmission circuit of claim 6, wherein the first level is a logic low level, the second level is a logic high level, and the output line is low terminated.

13. The data transmission circuit of claim 6, wherein the first level is a logic high level, the second level is a logic low level, and the output line is high terminated.

14. A data transmission circuit comprising:

a primary driver circuit configured to sequentially drive data lines to output pieces of data on the data lines to an output line; and a secondary driver circuit configured to drive the output line at the second level for a set time duration, when levels of two neighboring pieces of data among all the pieces of data transition from a first level to a second level, wherein when levels of two or more neighboring pieces of data among all the pieces of data are at the first level, the primary driver circuit drives the data line earlier by a variable amount of time than when no neighboring pieces of data are at the first level, wherein the variable amount of time in proportion to a number of the neighboring pieces having the first level.

* * * * *